United States Patent
Sato et al.

(10) Patent No.: US 9,780,154 B2
(45) Date of Patent: Oct. 3, 2017

(54) DISPLAY DEVICE AND ELECTRONIC APPARATUS WITH THIN CONNECTION BETWEEN DRIVING TFT AND LIGHT EMITTING ELEMENT

(71) Applicant: Joled Inc., Tokyo (JP)

(72) Inventors: Ayumu Sato, Tokyo (JP); Takashi Maruyama, Kanagawa (JP); Takahide Ishii, Kanagawa (JP)

(73) Assignee: JOLED Inc., Tokyo (JP)

( * ) Notice: Subject to any disclaimer, the term of this patent is extended or adjusted under 35 U.S.C. 154(b) by 45 days.

(21) Appl. No.: 14/638,568

(22) Filed: Mar. 4, 2015

(65) Prior Publication Data

US 2015/0279907 A1    Oct. 1, 2015

(30) Foreign Application Priority Data

Mar. 25, 2014   (JP) .................................. 2014-062256

(51) Int. Cl.
*H01L 27/32* (2006.01)
*H01L 51/52* (2006.01)

(52) U.S. Cl.
CPC ........ *H01L 27/326* (2013.01); *H01L 27/3202* (2013.01); *H01L 27/3248* (2013.01); *H01L 27/3272* (2013.01); *H01L 51/5218* (2013.01); *H01L 51/5253* (2013.01); *H01L 2227/323* (2013.01); *H01L 2251/568* (2013.01)

(58) Field of Classification Search
CPC ............... H01L 27/326; H01L 27/3202; H01L 27/3248
See application file for complete search history.

(56) References Cited

U.S. PATENT DOCUMENTS

2013/0234624 A1* 9/2013 Omoto ................... H05B 33/08
                                                              315/312
2015/0162399 A1* 6/2015 Sato ........................ H01L 29/12
                                                              257/43

FOREIGN PATENT DOCUMENTS

JP           2013-186448 A      9/2013

* cited by examiner

*Primary Examiner* — John P Dulka
(74) *Attorney, Agent, or Firm* — Michael Best & Friedrich LLP

(57) ABSTRACT

A display device of the present disclosure includes a plurality of pixels, in which a pixel includes a light-emitting element, a drive circuit which has a thin film transistor driving the light-emitting element, and a coupling unit which connects the light-emitting element and the drive circuit to each other, the light-emitting element has a configuration in which an organic layer including a light-emitting layer is interposed between a transparent electrode and a reflective electrode, the thin film transistor has a configuration which includes a semiconductor layer, an insulation layer, a first electrode layer, and a second electrode layer, and the coupling unit includes a metal layer which is thinner than the first electrode and the second electrode of the thin film transistor the metal layer being disposed in one portion of the coupling unit.

10 Claims, 12 Drawing Sheets

DISPLAY DEVICE AND ELECTRONIC APPARATUS WITH THIN CONNECTION BETWEEN DRIVING TFT AND LIGHT EMITTING ELEMENT

CROSS REFERENCE TO RELATED APPLICATIONS

This application claims the benefit of Japanese Priority Patent Application JP 2014-062256 filed Mar. 25, 2014, the entire contents of which are incorporated herein by reference.

BACKGROUND

The present disclosure relates to a display device, a manufacturing method of the display device, and an electronic apparatus.

In a display device, when foreign substances are mixed in a process of forming a light-emitting element (light-emitting portion) of a pixel, a brightness defect in the pixel occurs. For example, in a display device of an active drive system which uses a light-emitting element having a structure in which an organic layer including a light-emitting layer is interposed between a transparent electrode and a reflective electrode, an inter-electrode short circuit is caused between the transparent electrode and the reflective electrode of the light-emitting element due to foreign substances mixed in the manufacturing process in some cases. When the inter-electrode short circuit of the light-emitting element occurs, the light-emitting element does not emit light. Therefore, a pixel (sub-pixel) including the light-emitting element is visually confirmed as a non-light emitting pixel, a so-called brightness defect referred to as a dark spot occurs.

As a solution for the brightness defect due to a mixture of the foreign substances, a technology for forming a plurality of wirings that directly connects the respective light-emitting element and the drive circuit driving the light-emitting element to each other on the same surface as the reflective electrode layer is proposed (for example, refer to Japanese Unexamined Patent Application Publication No. 2013-186448). According to this technology, when the pixel has a dark spot defect, wiring which directly connects a defective light-emitting element and the drive circuit to each other is cut by emitting a laser, and the like, and thereby it is possible to recover (fix) the pixel which has a dark spot defect even after completion of the display panel.

SUMMARY

However, in a technology of the related art described in Japanese Unexamined Patent Application Publication No. 2013-186448, in order to shorten a light exposure process, when the reflective electrode layer described above is allowed to have a function of another electrode layer and a film is thickened by up to several hundred nm or more, it is difficult to cut wiring with a laser emitted after the completion of a display panel. This is because it is not possible to secure a space to which a melted electrode material is moved. As the example of a thickening process, there is, for example, a case in which a source/drain electrode layer and a reflective electrode layer in a thin film transistor constituting a pixel are formed to be a common layer. Therefore, in the display device in which electrode layers are formed to be a common layer and the number of light exposure processes decreases, a point defect such as a dark spot confirmed after the completion of the display panel is not recovered by emitting a laser thereto, and the number of final point defects is increased.

It is desirable to provide a display device in which it is possible to reduce the number of light-exposure processes by commonizing electrode layers and improve a point defect such as a dark spot, a manufacturing method of the display device, and an electronic apparatus.

According to an embodiment of the present disclosure, there is provided a display device, including a plurality of pixels, in which a pixel includes a light-emitting element, a drive circuit which has a thin film transistor driving the light-emitting element, and a coupling unit which connects the light-emitting element and the drive circuit to each other, the light-emitting element has a configuration in which an organic layer including a light-emitting layer is interposed between a transparent electrode and a reflective electrode, the thin film transistor has a configuration including a semiconductor layer, an insulation layer, a first electrode layer, and a second electrode layer, and the coupling unit includes a metal layer which is thinner than the first electrode and the second electrode of the thin film transistor, the metal layer being disposed in a portion of the coupling unit.

According to another embodiment of the present technology, there is provided a method of manufacturing the display device, including forming a coupling unit which includes a first electrode layer on a transparent substrate, forming an interlayer insulation layer on the coupling unit, and patterning a second electrode on a predetermined position of the interlayer insulation layer after forming an opening portion at a predetermined place of the interlayer insulation layer, and removing a portion of the coupling unit through the opening portion by performing over-etching during the patterning of the second electrode layer.

According to still another embodiment of the present disclosure, there is provided an electronic apparatus, including a display device which includes a plurality of pixels, in which a pixel includes a light-emitting element, a drive circuit which has a thin film transistor driving the light-emitting element, and a coupling unit which connects the light-emitting element and the drive circuit to each other, the light-emitting element has a configuration in which an organic layer including a light-emitting layer is interposed between a transparent electrode and a reflective electrode, the thin film transistor includes a semiconductor layer, an insulation layer, a first electrode layer, and a second electrode layer, and the coupling unit includes a metal layer which is thinner than the first electrode layer and the second electrode layer of the thin film transistor, the metal layer being disposed in a portion of the coupling unit.

According to the embodiments of the present disclosure, it is possible to improve a point defect such as a dark spot since a partial region of the coupling unit which becomes thinner can be cut with emitted laser and the like in a display device in which a reflective electrode and a second electrode are commonized.

Effects of the present disclosure are not necessarily limited to the effects described herein, but may be any effect described in the present specification. In addition, the effects described herein are only exemplifications; however, the present disclosure is not limited thereto, and there may be additional effects which occur.

DETAILED DESCRIPTION OF EMBODIMENTS

Figure 1:
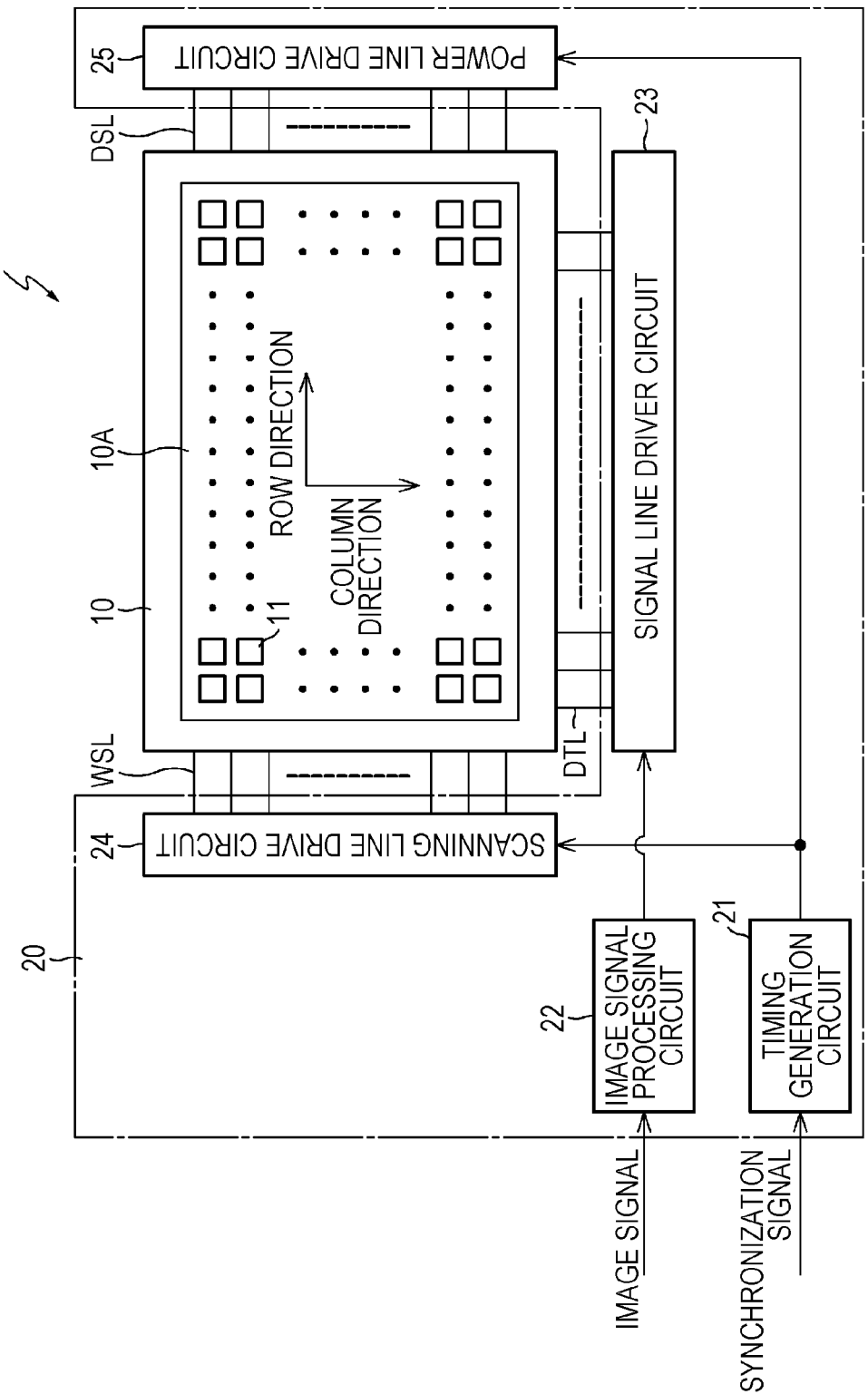
FIG. 1 is a system configuration diagram which shows an outline of a basic configuration of a display device according to one embodiment of the present disclosure.

Hereinafter, embodiments (hereinafter, described as "embodiment") for describing a technology of the present disclosure will be described in detail using drawings. A technology of the disclosure is not limited to the embodiments, and various numerical values, materials, and the like in the embodiment are exemplified. In a following description, the same reference numerals are used for the same elements or elements having the same function in order to avoid a duplicate description. The description will proceed in the following order.

1. Description entirely on a display, a manufacturing method of the display device, and an electronic apparatus of the disclosure 2. Active matrix type display device according to an embodiment 3. Electronic apparatus (an example of television set)

Description entirely on a display device, a manufacturing method of the display device, and an electronic apparatus of the disclosure In the display device, the manufacturing method of the display device, and the electronic apparatus of the disclosure, it is possible to have a configuration in which a first electrode layer of a thin film transistor is a gate electrode layer. In addition, it is possible to have a configuration in which the first electrode layer has a lamination structure.

In a display device including the above-described preferred configuration, the manufacturing method of the display device, and the electronic apparatus of the disclosure, a first electrode layer and a second electrode layer of the thin film transistor can be configured to have the same metal, respectively. At this time, the first electrode layer can be made from titanium and aluminum, or a lamination film containing an aluminum alloy layer, and the second electrode layer can be made of an aluminum alloy, or a lamination film containing the aluminum alloy.

In the display device of the present disclosure including the above-described preferred configuration, the manufacturing method of the display device, and the electronic apparatus of the disclosure, a pixel can include a plurality of light-emitting elements, and a coupling unit can be configured to connect each of the plurality of light-emitting elements and a drive circuit to each other.

Moreover, in the display device of the present disclosure including the above-described preferred configuration, the manufacturing method of the display device, and the electronic apparatus of the disclosure, a reflective electrode layer of a light-emitting element and a second electrode layer of the thin film transistor can be configured to be commonized. In addition, it is possible to provide a light shielding layer that prevents at least a portion of a silhouette of the coupling unit from being visually confirmed from the outside.

Active Matrix Type Display Device According to an Embodiment System Configuration FIG. 1 is a system configuration diagram which shows an outline of a basic configuration of a display device, for example, an active matrix type display device, according to an embodiment of the present disclosure.

The active matrix type display device (hereinafter, referred to as "display device" in some cases) is a display device which controls light-emission brightness of the light-emitting element (light-emitting portion) through an active element, for example, an insulation gate type field effect transistor, which is provided in the same pixel circuit as the light-emitting element. As the insulation gate type field effect transistor, a thin film transistor (TFT) can be typically used. In the following, "pixel circuit" is simply described as "pixel" in some cases.

A display device 1 according to the embodiment includes a display panel 10, and a peripheral drive unit 20 which drives the display panel 10 based on an image signal and a synchronization signal input from the outside. The peripheral drive unit 20 includes, for example, a timing generation circuit 21, an image signal processing circuit 22, a signal line drive circuit 23, a scan line drive circuit 24, and a power line drive circuit 25.

Display Panel

The display panel 10 includes a pixel array unit 10A in which a plurality of pixels 11 are two-dimensionally disposed in a matrix shape over the entire surface of a display region. The pixels 11 are pixels corresponding to a minimum unit point which configures a screen on the display panel 10. Each of the pixels 11 is an active matrix driven by the peripheral drive unit 20, and thereby the display panel 10 displays an image based on an image signal input from the outside.

Here, when the display panel 10 is a color display, one pixel (unit pixel) which is a unit for forming a color image is configured from a plurality of sub-pixels. At this time, each of the sub-pixels corresponds to the pixel 11 of FIG. 1. More specifically, in a display device which is a color display, one pixel is configured from three sub-pixels including, for example, a sub-pixel that contains a light emitting portion emitting red (R) light, a sub-pixel that contains a light-emitting portion emitting green (G) light, and a sub-pixel that contains a light emitting portion emitting blue (B) light.

However, one pixel is not limited to a combination of sub-pixels of three primary color of RGB, and it is also possible to configure one pixel by adding sub-pixels of one color or a plurality of colors to sub-pixels of three primary colors. More specifically, for example, it is possible to configure one pixel by adding a sub-pixel including a light-emitting portion which emits white (W) light so as to improve brightness, or to configure one pixel by adding at least one sub-pixel including a light-emitting portion which emits a complementary color light so as to enlarge the color reproduction range.

The display panel 10 includes a plurality of scan lines WSL extending in a row direction, a plurality of signal lines DTL extending in a column direction, and a plurality of power lines DSL extending in the row direction. The plurality of scan lines WSL are wired for each pixel row. The plurality of scan lines WSL each have one end connected to an output end corresponding to each row of the scan line drive circuit 24, and are used when selecting each pixel 11. The plurality of signal lines DTL are wired for each pixel column. The plurality of signal lines DTL each have one end connected to an output end corresponding to each column of the signal line drive circuit 23, and are used in when supplying a signal voltage corresponding to an image signal from the signal line drive circuit 23 to each pixel 11. The plurality of power lines DSL are wired for each pixel row. The plurality of power lines DSL each have one end connected to an output end corresponding to each row of the power line drive circuit 25, and are used in when supplying a drive current to each pixel 11. The pixel 11 is provided near an intersection between the plurality of signal lines DTL and the plurality of scan lines WSL.

Figure 2:
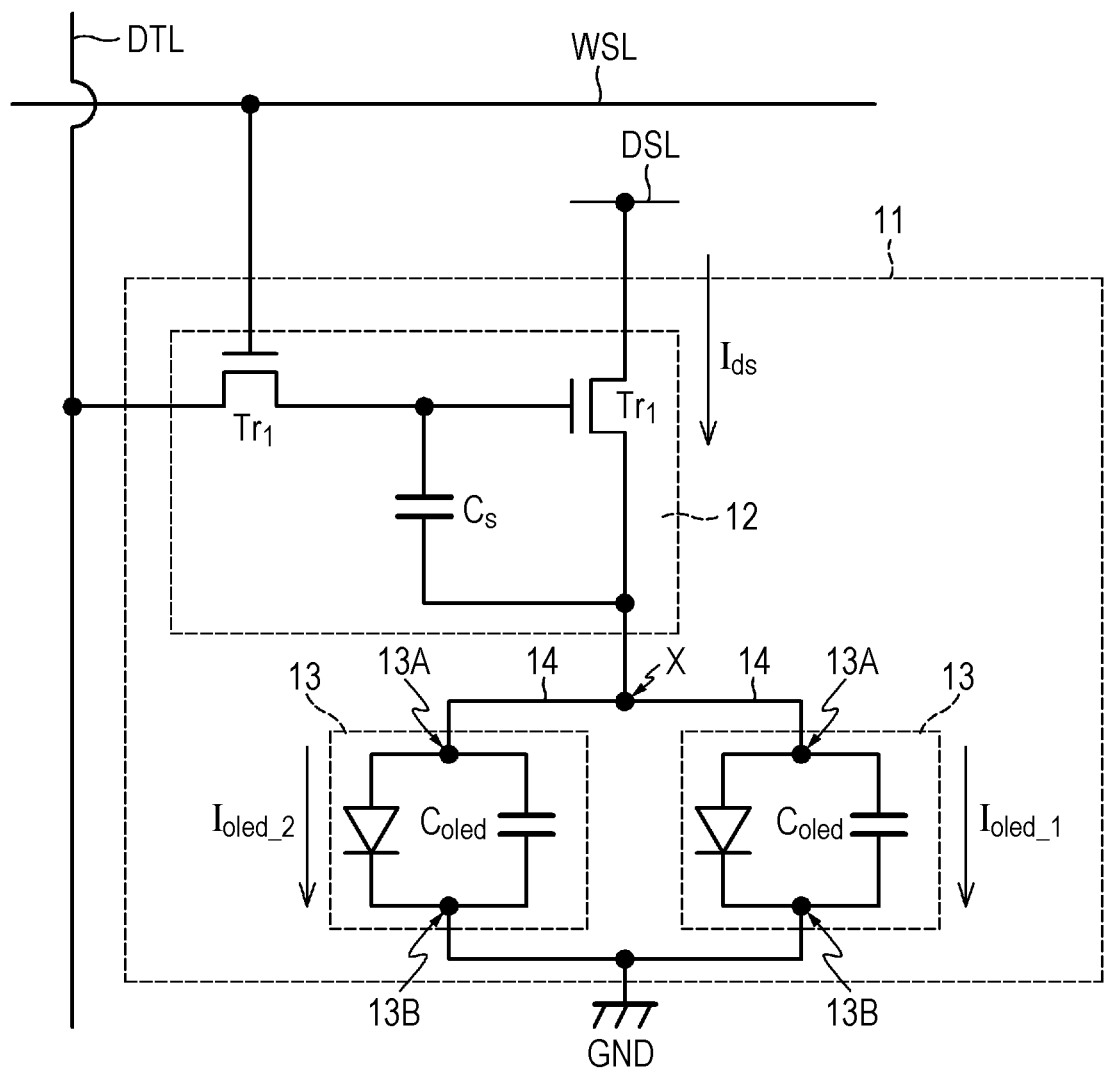
FIG. 2 is a circuit diagram which shows an example of a specific circuit configuration of a pixel (pixel circuit).

The display panel 10 further includes a ground line GND connected to a cathode electrode of the organic EL element 13 (refer to FIG. 2). The ground line GND is electrically connected to an external circuit (not shown) which is a ground potential. The ground line GND is a sheet-shaped electrode formed over the entire pixel array unit 10A. The ground line GND may be a belt-shaped electrode formed in a stripe shape corresponding to a pixel row or a pixel column. The display panel 10 further includes, for example, a frame region in which an image is not displayed on the periphery of the pixel array unit 10A. The frame region is covered by, for example, a light-shielding member.

Pixel Circuit

FIG. 2 is a circuit diagram which shows an example of a specific circuit configuration of a pixel (pixel circuit) 11. Here, as the light-emitting element of the pixel 11, for example, an active matrix type organic EL display device which uses an organic EL element is described as an example. The organic EL element is a self-light-emitting element, and is a current-driven type electro-optic element in which the light-emission brightness changes according to the current flowing in the device.

The pixel 11 includes a plurality of organic EL elements 13 which are connected to each other in parallel, one drive circuit 12 which drives each organic EL element 13, and a plurality of wirings 14 which directly connect respective organic EL elements 13 and the drive circuit 12 to each other. Specifically, the pixel 11 includes two organic EL elements 13 which are connected to each other in parallel, one drive circuit 12 which drives each organic EL element 13, and two wirings 14 which directly connect the respective organic EL element 13 and the drive circuit 12 to each other.

Here, the plurality (for example, two) of wirings 14 is an example of a coupling unit which connects the organic EL element 13 and the drive circuit 12 to each other.

The organic EL element 13 has a configuration in which an organic layer 13C (refer to FIGS. 4A and 4B) to be described later is interposed between, for example, an anode electrode 13A and a cathode electrode 13B. The cathode electrode 13B is a transparent electrode configured to include a material transparent to light in the organic layer 13C, and a material having conductivity. As such a material, for example, indium tin oxide (ITO), tin oxide (SnO), indium zinc oxide (IZO), and the like can be exemplified.

The organic layer 13C has a lamination structure which is made by sequentially laminating, for example, a hole injection layer, a hole transport layer, a light-emitting layer, and an electron transport layer from the cathode electrode 13B, which are not shown. The organic layer 13C may include a layer in addition to the layers exemplified above when necessary, and may not include one or both of the hole transport layer and the electron transport layer. Here, the hole injection layer is intended to increase hole injection efficiency. The hole transport layer is intended to increase hole transport efficiency to a light-emitting layer. The light-emitting layer is intended to cause a recombination of an electron and a hole through an electric field generated between the cathode electrode 13B and the anode electrode 13A, and to generate light. The electron transport layer is intended to increase electron transport efficiency to the light-emitting layer.

Figure 3:
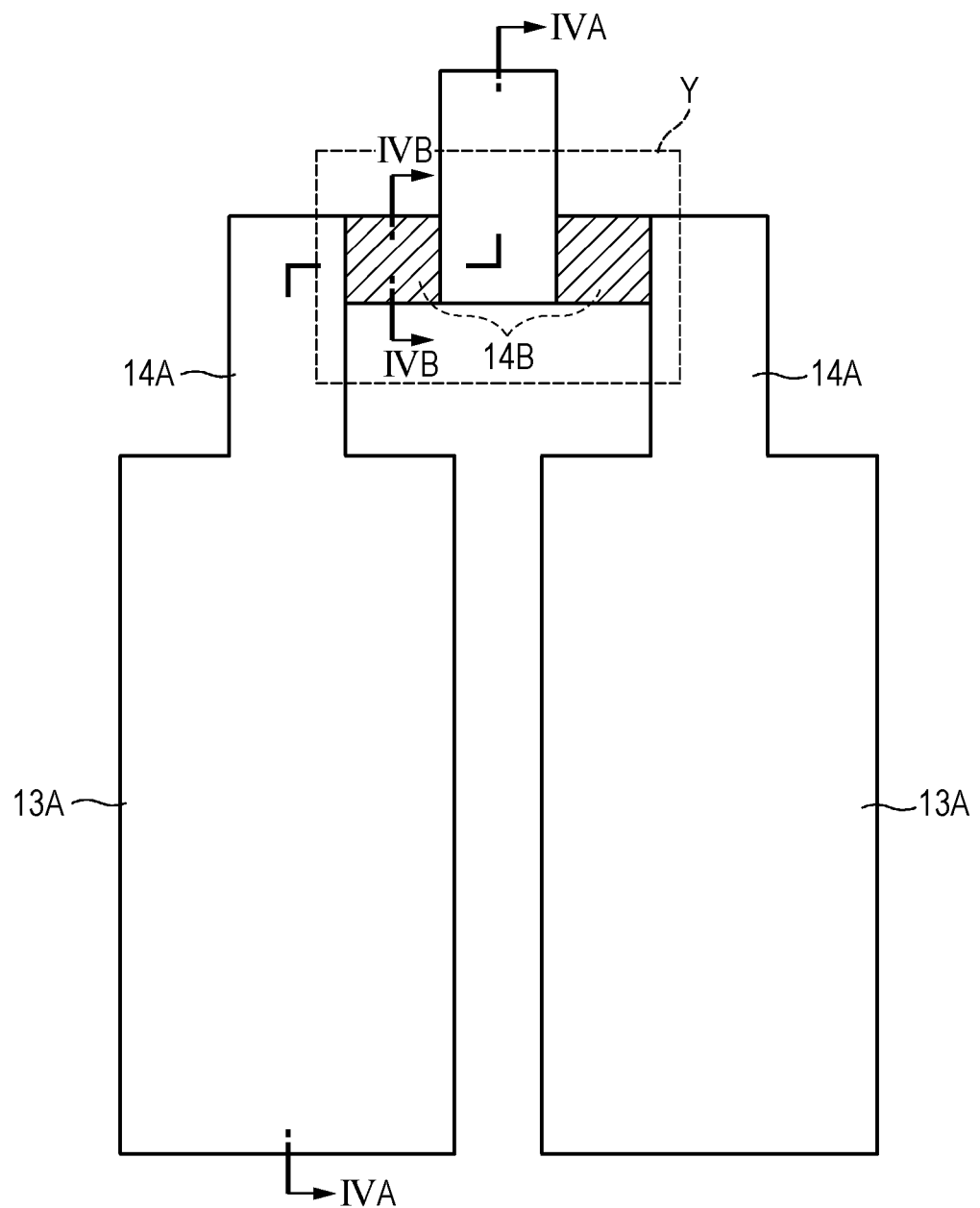
FIG. 3 is a layout diagram which shows an example of a layout diagram of an anode electrode of an organic EL element and a wiring configuring a coupling unit.
Figure 4A:
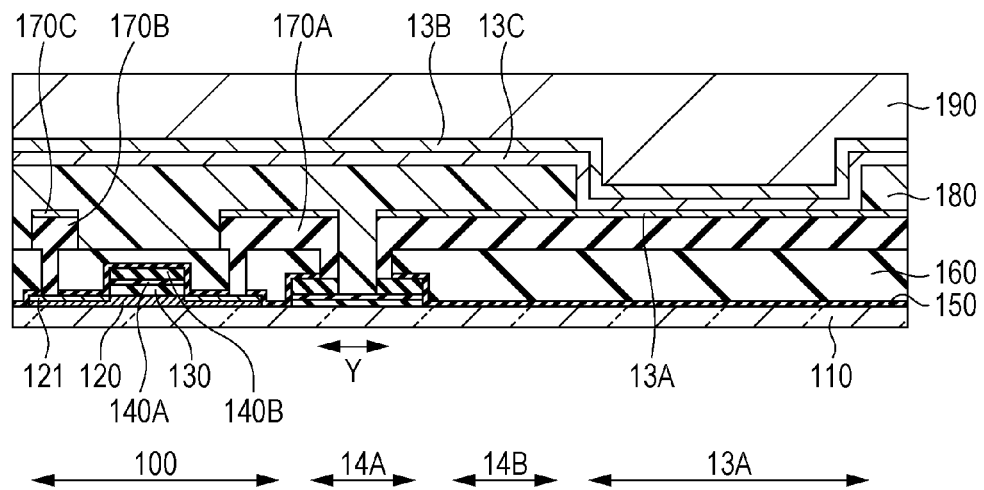
FIG. 4A is a cross-sectional view seen in an arrow direction of line IVA-IVA of FIG. 3.
Figure 4B:
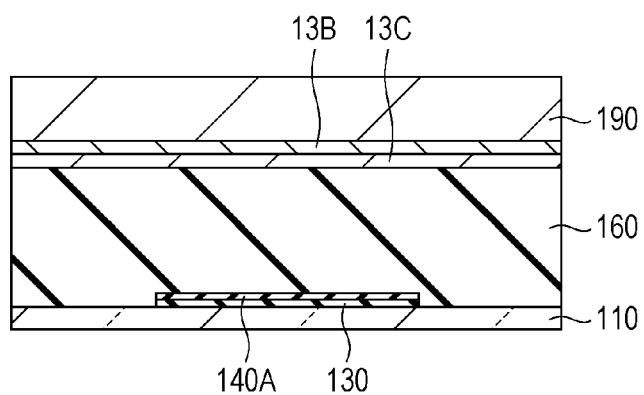
FIG. 4B is a cross-sectional view seen in an arrow direction of line IVB-IVB of FIG. 3.

FIG. 3 is a layout diagram which shows an example of a layout diagram of an anode electrode 13A of an organic EL element 13 and a wiring 14. FIG. 4A shows a cross-sectional view seen in an arrow direction of line IVA-IVA of FIG. 3, and FIG. 4B is a cross-sectional view seen in an arrow direction of line IVB-IVB of FIG. 3. The wiring 14 configures a coupling unit which connects an organic EL element 13 and a drive circuit 12 to each other.

The anode electrode 13A is a reflective electrode which reflects light generated in the organic layer 13C with high reflectance. The wiring 14 is configured to have a portion 14A (hereinafter, described as "wiring 14A") formed on the same surface as the anode electrode 13A and a source/drain electrode 170, and a portion 14B (hereinafter, described as "wiring 14B") formed on the same surface as the gate electrode 140.

The wiring 14A has the same layer structure as the anode electrode 13A and the source/drain electrode 170, is collectively formed with the anode electrode 13A and the source/drain electrode 170, and is integrally formed with the anode electrode 13A. The wiring 14B has the same layer structure as the first gate electrode 140A to be described later. In addition, the wiring 14B is formed in a region inside an opening portion Y of a protective layer 150 and an interlayer insulation layer 160. On the other hand, the wiring 14A and the wiring 14B are electrically connected through the opening of the protective layer 150 and the interlayer insulation layer 160, and are preferably connected in the opening portion Y so as to efficiently form a pixel circuit. The wiring 14 has a belt-shape and connects the anode electrode 13A and the drive circuit 12 (specifically, a source electrode 170A to be described later).

The drive circuit 12 is configured to have, for example, a drive transistor $Tr_1$, a write transistor $Tr_2$, and a retention capacity Cs, and has a circuit configuration of 2Tr1C made of two transistors Tr and one capacity element (C). The write transistor $Tr_2$ samples a voltage of a signal line DTL to be described later, and writes a sampled voltage in the pixel 11.

The retention capacity $C_s$ holds the voltage written by the write transistor $Tr_2$. The drive transistor $Tr_1$ controls a current flowing in the organic EL element 13 according to the magnitude of the voltage held by the retention capacity $C_s$. The drive circuit 12 may have a circuit configuration which is different from the circuit configuration of 2Tr1C described above.

The drive transistor $Tr_1$ and the write transistor $Tr_2$ are formed by, for example, an N-channel MOS type thin film transistor (TFT). The type of the TFT used is not particularly limited, but may be a reverse stagger structure (so-called, a bottom-gate type), or may be a stagger structure (so-called, a top-gate type). In addition, the driver transistor $Tr_1$ and the write transistor $Tr_2$ may be formed of a p-channel MOS type TFT, or may be formed of a combination of the N-channel MOS type TFT and the P-channel type TFT.

A gate electrode of the write transistor $Tr_2$ is connected to a scan line WSL. One source/drain electrode of the write transistor $Tr_2$ is connected to the signal line DTL, and the other source/drain electrode of the write transistor $Tr_2$ is connected to a gate electrode of the drive transistor $Tr_1$. One source/drain electrode of the drive transistor $Tr_1$ is connected to the power line DSL, and the other source/drain electrode of the drive transistor $Tr_1$ is connected to an anode electrode of the organic EL element 13. One end of the retention capacity Cs is connected to the gate electrode of the drive transistor Tr1, and the other end of the retention capacity $C_s$ is connected to the other source/drain electrode of the drive transistor $Tr_1$. The organic EL element 13 includes an element capacity (equivalent capacity) $C_{oled}$.

Wiring of a Coupling Unit and Cross-Sectional Configuration in a Vicinity of the Wiring Next, the wiring 14 which configures a coupling unit in the display panel 10 and a cross-sectional configuration in the vicinity of the wiring will be described referring to FIGS. 4A and 4B. The wiring 14 configures the coupling unit which connects the organic EL element 13 and the drive circuit 12 to each other.

The display panel 10 includes a semiconductor layer 120, a gate insulation film 130, a gate electrode 140, a protective layer 150, and an interlayer insulation layer 160 which are sequentially laminated from a substrate 110 side on the transparent substrate 110 in the wiring 14 and in the vicinity of the wiring. The protective layer 150 and the interlayer insulation layer 160 include a plurality of openings. The display panel 10 includes a source electrode 170A and a drain electrode 170B which are provided so as to fill, for example, an opening between the protective layer 150 and the interlayer insulation layer 160.

The display panel 10 further includes, for example, a conductive layer 170C on the same plane as the source electrode 170A and the drain electrode 170B, and a buried layer 180 provided with an opening from which a portion of an upper surface of the conductive layer 170C is exposed. The conductive layer 170C is configured from the same material as the source electrode 170A and the drain electrode 170B. A portion of the conductive layer 170C exposed in the opening of the buried layer 180 corresponds to the anode electrode 13A of the organic EL element 13. A portion of the conductive layer 170C in contact with the upper surface of the source electrode 170A (a connection portion X of FIG. 2) corresponds to a place which connects each wiring 14 to each other, and is connected to the drive circuit 12. The display panel 10 further includes, for example, the organic layer 13C which is in contact with the upper surface of the conductive layer 170C exposed in the opening of the buried layer 180, a cathode electrode 13B in contact entirely with the buried layer 180 and an upper surface of the organic layer 13C, and a protective film 190 which protects the cathode electrode 13B.

Figure 5A:
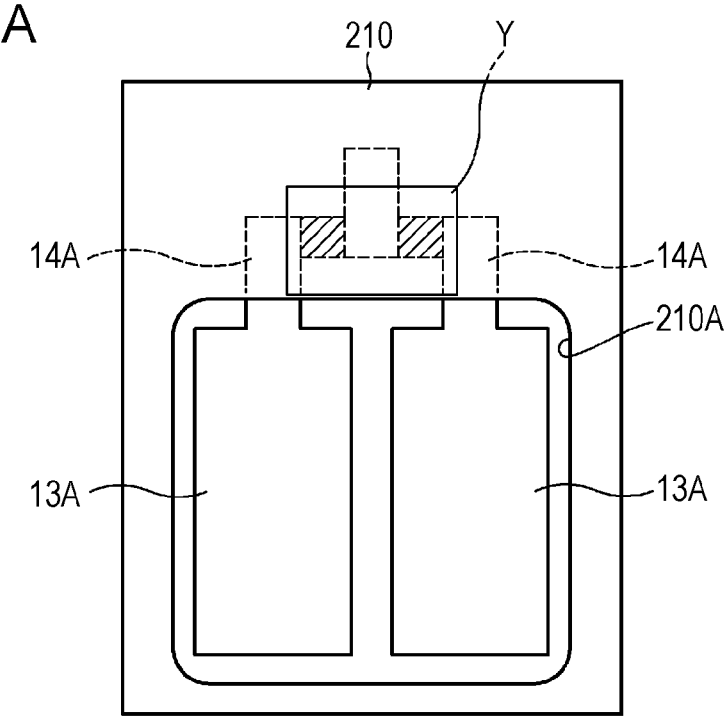
FIG. 5A is a plan view which shows a case where one opening for two anode electrodes is provided on a light-shielding layer.
Figure 5B:
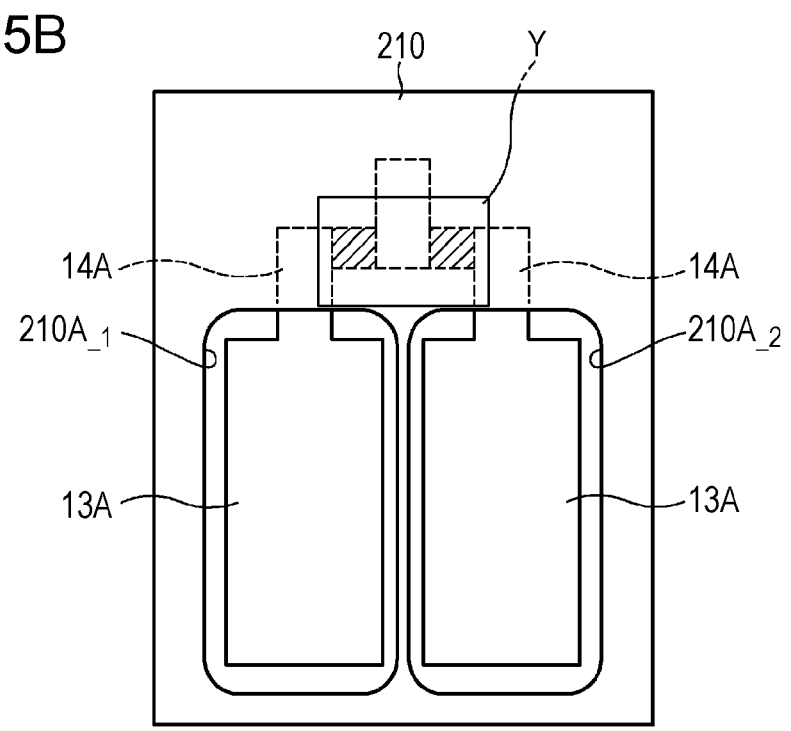
FIG. 5B is a plan view which shows a case where one opening for every two anode electrodes is provided on the light-shielding layer.

Here, the display panel 10 does not include any member which shields laser light when emitting laser light to a lower surface of the wiring 14B between each wiring 14B and the transparent substrate 110. On the other hand, the display panel 10 includes, for example, a light-shielding layer 210 which prevents at least one portion of the silhouette of each wiring 14 configuring the coupling unit from being visually confirmed from the outside between each wiring 14 and the protective film 190 as shown in FIGS. 5A and 5B. The light-shielding layer 210 is configured from a light-shielding member (for example, black matrix), and includes at least one opening at a place right on the anode electrode 13A. In FIG. 5A, a case where one opening 210A is provided in the light-shielding layer 210 with respect to two anode electrodes 13A is exemplified. In FIG. 5B, a case where one of openings $210A_{-1}$ or $210A_{-2}$ for every two anode electrodes 13A is provided in the light-shielding layer 210 is exemplified.

Peripheral Drive Unit

Next, a peripheral drive unit 20 which drives the display panel 10 will be described.

As previously described, the peripheral drive unit 20 is configured to have, for example, a timing generation circuit 21, an image signal processing circuit 22, a signal line drive circuit 23, a scan line drive circuit 24, and a power line drive circuit 25.

The timing generation circuit 21 generates a timing control signal for control so that circuits in the peripheral drive unit 20 operate in conjunction with each other. Specifically, the timing generation circuit 21 outputs a timing control signal to each of the circuits 21 to 25 described above according to (by being synchronized with), for example, a synchronization signal input from the outside.

The image signal processing circuit 22 performs predetermined correction processing, for example, on a digital image signal input from the outside, and outputs an image signal after the correction processing to the signal line drive circuit 23. Here, as the predetermined correction processing, for example, gamma correction or overdrive correction can be exemplified.

The signal line drive circuit 23 applies a voltage of an analog signal corresponding to an image signal input from the image signal processing circuit 22 to each signal line DTL according to (by being synchronized with), for example, an input of a timing control signal from the timing generation circuit 21. The signal line drive circuit 23 can output, for example, two types of voltages $V_{ofs}$ and $V_{sig}$. Specifically, the signal line drive circuit 23 is adapted to selectively supply the two types of voltages $V_{ofs}$ and $V_{sig}$ to the pixel 11 selected by the scan line drive circuit 24 through the signal line DTL. Here, $V_{sig}$ is a voltage value corresponding to an image signal. $V_{ofs}$ is a constant voltage which is a reference of the image signal. A minimum voltage of $V_{sig}$ has a voltage value lower than $V_{ofs}$, and a maximum voltage of $V_{sig}$ has a voltage value higher than $V_{ofs}$.

The scan line drive circuit 24 sequentially selects a plurality of scan lines WSL for each predetermined unit according to (by being synchronized with), for example, an input of a timing control signal from the timing generation circuit 21. The scan line drive circuit 24 can output, for example, two types of voltages $V_{on}$ and $V_{off}$. Specifically, the scan line drive circuit 24 selectively supplies, for example, two types of voltages $V_{on}$ and $V_{off}$ to the pixel 11 to be driven through the scan line WSL, and is adapted to perform on/off control of the write transistor $Tr_2$. Here, $V_{on}$ is a value of an ON voltage or more of the write transistor $Tr_2$. $V_{off}$ is a value lower than the ON voltage of the write transistor $Tr_2$, and is a value lower than $V_{on}$.

The power line drive circuit 25 sequentially selects a plurality of power lines DSL for each predetermined unit according to (by being synchronized with), for example, the input of a timing control signal from the timing generation circuit 21. The power line drive circuit 25 can selectively output, for example, two types of voltages $V_{cc}$ and $V_{ss}$. Here, $V_{ss}$ is a voltage value lower than a voltage $(V_{el}+V_{cath})$ which is obtained by combining a threshold voltage $V_{el}$ of the organic EL element 13 and a cathode voltage $V_{cath}$ of the organic EL element 13. $V_{cc}$ is a voltage value of $(V_{el}+V_{cath})$ or more.

Circuit Operation

The following describes an example of a circuit operation of the display device 1 according to the embodiment of a configuration described above. In the display device 1 shown in FIG. 1, the signal line drive circuit 23 outputs a signal voltage $V_{sig}$ corresponding to an image signal to each signal line DTL. On the other hand, the scan line drive circuit 24 sequentially outputs a selection pulse to a plurality of scan lines WSL on a row-by-row basis in synchronization with a timing control signal given by the timing generation circuit 21. Moreover, the power line drive circuit 25 selectively outputs a sequential voltage $V_{cc}/V_{ss}$ to the plurality of power lines DSL on a row-by-row basis in synchronization with the timing control signal given by the timing generation circuit 21.

Under the drive by the scan line drive circuit 24 and the power line drive circuit 25, scanning in a column direction (vertical direction) is performed on each pixel 11 of the pixel array unit 10A, and each pixel 11 of the pixel array unit 10A is selected on a row-by-row basis. Accordingly, the drive circuit 12 is on/off controlled in each selected pixel 11 of a pixel row. Then, a drive current is injected into two organic EL elements 13 of each pixel 11, and thereby light emission is caused by recombining a hole and an electron, and the light is extracted to the outside. As a result, an image is displayed in the pixel array unit 10A which is a display region of the display panel 10.

Manufacturing Process

Figure 6:
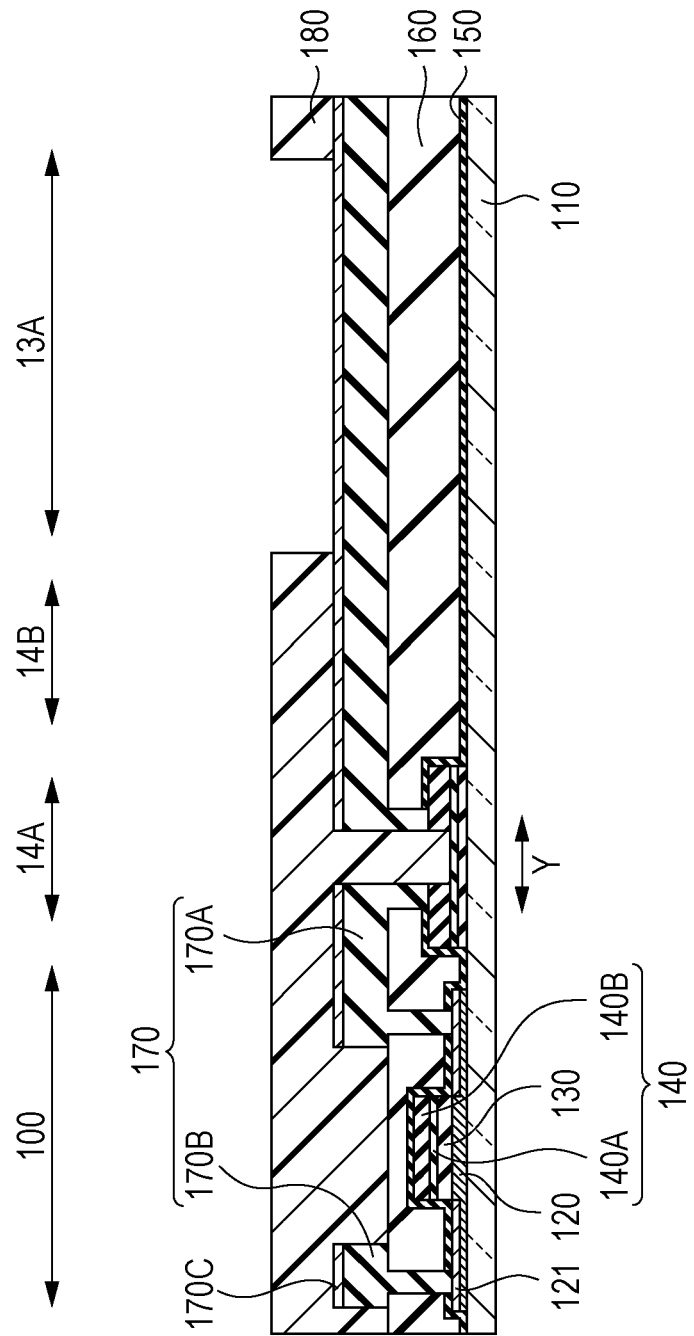
FIG. 6 is a cross-sectional view which shows a cross-sectional structure of a thin film transistor, a wiring configuration of the coupling unit, and an anode electrode according to an example of the disclosure.

FIG. 6 is a cross-sectional view which shows a cross-sectional structure of a thin film transistor 100 (drive transistor $Tr_1$ and write transistor $Tr_2$), wirings 14A and 14B configuring the coupling unit, and an anode electrode 13A according to an example of the disclosure.

The thin film transistor 100 is used as a drive element in the organic EL display device, and has, for example, a top gate type configuration, and is formed on the transparent substrate 110. Specifically, in thin film transistor 100, the semiconductor layer 120, a low resistance region 121 in the layer, the gate insulation film 130, the gate electrode 140 (140A and 140B) which is a first electrode layer, the protective layer 150, the interlayer insulation layer 160, and the source/drain electrode 170 (170A, 170B) which is a second electrode layer are laminated in this order. The wiring 14 which is simultaneously formed at this time is formed by the gate electrode 140 and the source/drain electrode 170.

The transparent substrate 110 is configured to have, for example, a glass substrate, a plastic film, or the like. As a plastic material, for example, polyethylene terephthalate (PET), polyethylene naphthalate (PEN), and the like can be exemplified. When an oxide semiconductor to be described later is used as the semiconductor layer 120, the semiconductor layer 120 is formed without heating the transparent substrate 110 through a sputtering method, such that it is possible to use an inexpensive plastic film.

The semiconductor layer 120 is provided in an island shape which includes the gate electrode 140 and the vicinity thereof on the transparent substrate 110, and has a function as an active layer of the thin film transistor 100. The semiconductor layer 120 has, for example, a thickness of about 50 nm, and is configured to have an oxide semiconductor, silicon, or the like. Here, the oxide semiconductor is a compound which includes elements such as indium, gallium, zinc, tin, and the like and oxygen. Specifically, as an amorphous oxide semiconductor, oxide indium gallium zinc (IGZO) and the like can be exemplified. As a crystalline oxide semiconductor, zinc oxide (ZnO), indium zinc oxide (IZO (registered trademark)), oxide indium gallium (IGO), indium tin oxide (ITO), indium oxide (InO), and the like can be exemplified.

In addition, a region of the semiconductor layer 120 facing the gate electrode 140 is a channel region. The gate insulation film 130 and the gate electrode 140 are provided in the same shape in this order on the channel region, and the low resistance regions 121 are provided on both sides of the channel region, and are used as a source region/a drain region.

When the semiconductor layer 120 is configured to have the oxide semiconductor, some or all of the low resistance region 121 from an upper surface in a depth direction has a low resistance compared with the channel region. When the semiconductor layer 120 is the oxide semiconductor, the low resistance region 121 has a low resistance obtained by reacting a metal such as aluminum (Al) and diffusing the metal into the oxide semiconductor. Accordingly, the thin film transistor 100 can have a self-aligned structure and stabilize the characteristics thereof. In addition, the low resistance region 21 may be formed through ion doping or plasma processing.

The gate insulation film 130 has, for example, a thickness of about 300 nm, and is configured to have a single-layer film or a lamination film such as a silicon oxide film, a silicon nitride film, a silicon oxynitride film, or an aluminum oxide film.

The gate electrode 140 has a role of applying a gate voltage to the thin film transistor 100, and of controlling an electron density in the semiconductor layer 120 with the gate voltage. The gate electrode 140 is configured to have a first gate electrode 140A which is not etched, and a second gate electrode 140B which is etched by a chemical solution or gas when etching the source/drain electrode 170 to be described later.

The gate electrode 140 is provided in a selective region on the transparent substrate 110, and has a lamination structure of the first gate electrode 140A and the second gate electrode 140B. The first gate electrode 140A has, for example, a thickness of 10 nm to 150 nm, more specifically about 50 nm, and is configured to include titanium (Ti) or oxide indium gallium (IGO), indium tin oxide (ITO), zinc oxide indium tin (ITZO), and the like. The second gate electrode 140B has, for example, a thickness of about 500 nm, and is configured to include a lamination film of molybdenum (Mo) and aluminum (Al), aluminum containing neodymium (AnNd), copper (Cu), and the like.

The protective layer 150 is provided between the interlayer insulation layer 160 and the semiconductor layer 120, the gate insulation film 130, and the gate electrode 140. When the oxide semiconductor is used as the semiconductor layer 120, the protective layer 150 is an insulation film formed by the oxidization of a metal film as a supply source of a metal diffused into the low resistance region 121, or an insulation film formed by subsequently performing a sputtering method, an atomic layer deposition method, or the like on the insulation film formed by the oxidization. The protective layer 150 is configured to include, for example, aluminum oxide, titanium oxide, indium oxide, or a lamination film of tin oxide and aluminum oxide.

The protective layer 150 formed of an insulation film of aluminum oxide and the like has good barrier properties against outside air, and it is possible to reduce an influence of oxygen or moisture which changes electrical characteristics of the semiconductor layer 120. Thus, the protective layer 150 is provided, and thereby electrical characteristics of the thin film transistor 100 can be stabilized, and an effect of the interlayer insulation layer 160 can be further enhanced. A thickness of the protective layer 150 is, for example, about 50 nm.

The interlayer insulation layer 160 is formed on the protective layer 150, and is formed by using an organic material such as acrylic, polyimide, or siloxane, a silicon dioxide film, a silicon nitride film, a silicon oxynitride film, aluminum oxide, or a lamination film including these. When an organic film is used in the interlayer insulation layer 160, it is possible to easily increase film thickness. Therefore, it is possible to sufficiently insulate a step formed after the gate electrode. A thickness of the interlayer insulation layer 160 is, for example, about 2 um.

Then, a connection hole which connects the source/drain electrode 170 and the wiring 140C formed on the same plane as the low resistance region 121 of the semiconductor layer 120 or the gate electrode 140 is formed in the interlayer insulation layer 160 and the protective layer 150. In addition, as shown in FIGS. 3 and 6, the opening portion Y is formed on the wiring 14.

The source/drain electrode 170 has a thickness of about 150 nm to 1 um, and is configured to include, for example, molybdenum (Mo) and aluminum (Al), and aluminum containing neodymium which configures the anode electrode 13A of the organic EL element 13. In addition, it is preferable that the source/drain electrode 170 is configured to include a low resistance metal such as aluminum (Al) or copper (Cu) in the same manner as the gate electrode 140. Furthermore, it is preferable that the source/drain electrode is a lamination film obtained by combining a low resistance layer made of aluminum (Al) or copper (Cu), and a barrier layer made of titanium (Ti) or molybdenum (Mo). By using such a lamination film, drive with less wiring delay is possible.

In addition, a top portion of the source/drain electrode 170 is configured to be used as the anode electrode 13A in the organic EL element 13 using aluminum containing neodymium, indium tin oxide, or the like. Furthermore, a layer of the second gate electrode 140B exposed in the opening portion Y is etched by performing over-etching during the patterning of the source/drain electrode 170, and thereby a cross-sectional structure of the opening portion Y in FIG. 6 is realized.

The organic EL element 13 is provided on the interlayer insulation layer 160. Specifically, as shown in FIG. 4A, the organic EL element 13 has the anode electrode 13A, the buried layer 180, the organic layer 13C, and the cathode electrode 13B which are sequentially laminated from the interlayer insulation layer 160 side, and is sealed by the protective film 190. A sealing substrate (not shown) is bonded onto the protective film 190 over an adhesive layer (not shown) made from a thermosetting resin or an ultraviolet curable resin.

The buried layer 180 is adapted to ensure an insulation property between the anode electrode 13A and the cathode electrode 13B, and to separate light-emitting region s of each element, and has openings facing a light-emitting region of each element, and has an opening. The buried layer 180 is configured from a photosensitive resin such as polyimide, an acrylic resin, or a novolac resin.

The organic layer 13C is provided so as to cover an opening of the buried layer 180. The organic layer 13C includes an organic electroluminescent light-emitting layer (organic EL layer), and light is emitted in response to drive current. The organic layer 13C has a hole injection layer, a hole transport layer, an organic EL layer, and an electron transport layer which are sequentially laminated from, for example, a transparent substrate 110 (anode electrode 13A) side, and light is generated by the occurrence of recombination of electrons and holes in the organic EL layer.

A configuration material of the organic EL layer may be an organic material of general low molecular or high molecular, but is not particularly limited. For example, an organic EL layer which emits, for example, red light, green light, and blue light may be painted in each element. Alternatively, the organic EL layer (for example, a lamination of organic EL layers of red light, green light, and blue light) which emits white light may be provided over an entire surface of the transparent substrate 110. The hole injection layer is intended to increase hole injection efficiency and to prevent leakage. The hole transport layer is intended to improve hole transport efficiency to the organic EL layer. The hole injection layer, the hole transport layer, or a layer other than the organic EL layer such as the electron transport layer may be provided when necessary.

The cathode electrode 13B is configured to include a metal conductive film made of a transparent conductive film such as ITO or IZO. The cathode electrode 13B is, for example, provided in common in each element in an insulated state from the anode electrode 13A.

The protective film 190 may be configured by any of an insulation material and a conductive material. As the insulation material, for example, amorphous silicon (a-Si), amorphous silicon carbide (a-SiC), amorphous silicon nitride (a-Si (1-X) NX), or amorphous carbon (a-C) can be exemplified.

The above-described sealing substrate which is bonded to the protective film 190 through an adhesive layer 200 is disposed between the thin film transistor 100 and the organic EL element 13 so as to face the transparent substrate 110. It is possible to use the same material as in the transparent substrate 110 in the sealing substrate. A transparent material may be used in the sealing substrate, and a color filter or light-shielding film may be provided on a sealing substrate side.

Manufacturing Method

Next, a method of manufacturing a display device of the disclosure, more specifically, a method of manufacturing the thin film transistor 100 and the wiring 14 will be described using a process diagram of FIGS. 7A to 7F. FIGS. 7A to 7F are process diagrams which show the method of manufacturing the thin film transistor 100 and the wiring 14 in a process order. FIGS. 7A to 7F show processes 1 to 6, respectively.

Figure 7A:
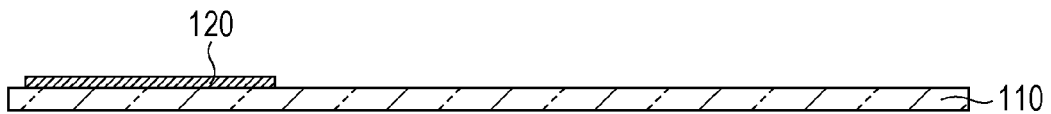
FIGS. 7A to 7F are process diagrams which show a method of manufacturing a display device of the present disclosure in a process order.

First, the oxide semiconductor is formed with a thickness of about 50 nm on an entire surface of the transparent substrate 110 by, for example, the sputtering method in process 1 of FIG. 7A. At this time, as a target, a ceramic target of the same composition as an oxide to be formed is used. In addition, since a carrier concentration in the oxide semiconductor greatly depends on partial oxygen pressure when performing sputtering, the oxygen partial pressure is controlled so as to obtain desired transistor characteristics.

Then, the semiconductor layer 120 is formed by forming the oxide semiconductor in an island shape by performing, for example, photolithography and etching. At this time, it is preferable to perform a process by wet etching using a mixed solution of phosphoric acid, nitric acid and acetic acid. The mixed solution of phosphoric acid, nitric acid and acetic acid can sufficiently increase a selection ratio of a base, and can be relatively easily processed.

Figure 7B:
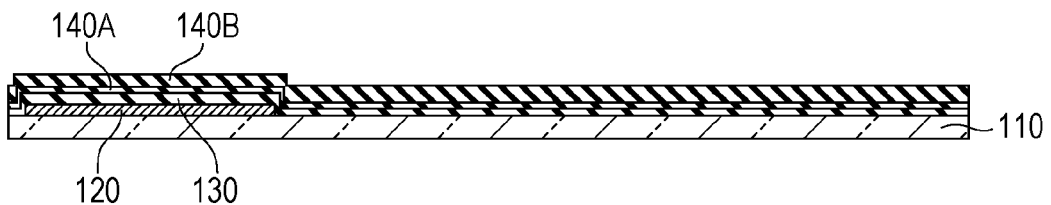

Then, the gate insulation film 130 such as a silicon oxide film or an aluminum oxide film is formed with a thickness of about 200 nm on the entire upper surface of the transparent substrate 110 and the semiconductor layer 120 by, for example, a plasma chemical vapor deposition (CVD) method and the like in Process 2 of FIG. 7B. A silicon oxide film can be also formed by a reactive sputtering method in addition to the plasma CVD method. Moreover, an aluminum oxide film can be formed by the reactive sputtering method, the CVD method, or the atomic layer deposition method.

A first gate electrode 140A made from titanium (Ti) is further formed with a thickness of about 50 nm on an entire surface of the gate insulation film 130 by, for example, the sputtering method in Process 2. In addition, a second gate electrode 140B made from a lamination film of aluminum (Al) and molybdenum (Mo) is further formed with a thickness of about 500 nm on the first gate electrode 140A.

Figure 7C:
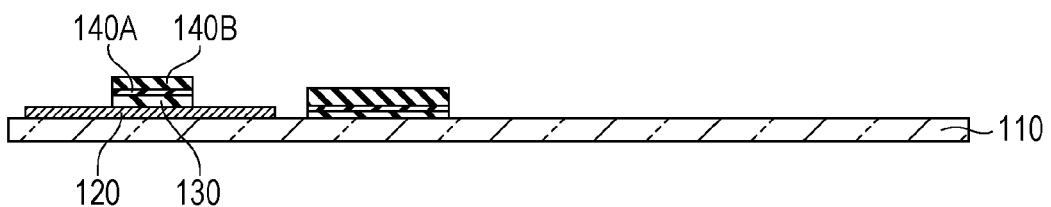

Then, the gate electrode 140 is processed to be in a desired shape, for example, by photolithography and etching, and the gate insulation film 130 is etched by using the gate electrode 140 as a mask, and thereby the gate insulation film 130 is processed to have the same shape as the gate electrode 140 in Process 3 of FIG. 7C. At this time, when the oxide semiconductor layer 120 is configured from a crystallized material such as ZnO, IZO, IGO, and the like, it is possible to easily perform the process in the etching of the gate insulation film 130 by maintaining a very large etching selection ratio using a chemical solution such as hydrofluoric acid. Accordingly, the gate insulation film 130 and the gate electrode 140 are formed in the same shape in this order on a channel region of the semiconductor layer 120.

Figure 7D:
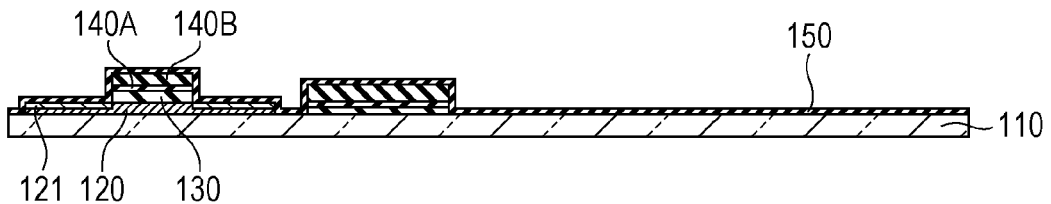

Then, a metal film made from a metal such as aluminum (Al), indium (In), or tin (Sn), which reacts with oxygen and the oxide semiconductor at a relatively low temperature is formed with a thickness of, for example, 5 nm or more and 10 nm or less on a surface of the semiconductor layer 120, the gate insulation film 130, and the gate electrode 140 by, for example, the sputtering method or the atomic layer deposition method in Process 4 of FIG. 7D. Subsequently, an insulation film with high barrier properties such as an aluminum oxide film is formed with a thickness of about 50 nm by using, for example, the sputtering method or the atomic layer deposition method.

After forming a metal film and an insulation film such as aluminum oxide, thermal processing is performed in an atmosphere containing oxygen, and thereby a metal oxide film formed by the oxidization of the metal film and the protective layer 150 made from the insulation film such as aluminum oxide are formed. At this time, the low resistance region 121 is simultaneously formed in the semiconductor layer 120 which is a source/drain region of the thin film transistor 100. During the oxidization reaction of the metal film, some of oxygen contained in the semiconductor layer 120 is depleted. Therefore, the oxygen concentration from the upper surface side which is in direct contact with the metal film in the semiconductor layer 120 is lowered along with the progression of oxidization of the metal film. At the same time, a metal such as aluminum is diffused into the oxide semiconductor from the metal film, and functions as a dopant, and as a result a region of the oxide semiconductor layer 120 in contact with the metal film has low resistance, and thereby the low resistance region 121 is formed. The low resistance region 121 is used as a source/drain region in the thin film transistor 100.

As the method of thermally processing the metal film, for example, as described above, it is preferable to perform thermal processing in an atmosphere containing oxygen at a temperature of about 200° C. At this time, it is possible to suppress the oxygen concentration of the low resistance region 121 not to be too low, and to supply sufficient oxygen to the semiconductor layer 120 by performing annealing in an oxidizing gas atmosphere containing oxygen and the like. Therefore, it is possible to shorten an annealing process to be performed in a subsequent process, and the process can be simplified.

In addition, for example, in Process 4 of FIG. 7D, that is, a process of forming the metal film, the temperature of the transparent substrate 110 is set to be a relatively high temperature of about 200° C., and thereby the low resistance region 121 can be formed without performing the thermal processing. In this case, it is possible to reduce a carrier concentration in the semiconductor layer 120 made from the oxide semiconductor to a level necessary for a transistor.

As described above, it is preferable that the metal film is formed to have a thickness of 10 nm or less. This is because a metal film can be completely oxidized by thermal processing if the thickness of the metal film is 10 nm or less. When the metal film is not completely oxidized, a process of removing the metal film by etching is necessary. When the metal film is completely oxidized so as to be an insulation film with high resistance, the process of removing the metal film by etching is not necessary, and thus the manufacturing process can be simplified. When the metal film is formed to have a thickness of 10 nm or less, the thickness of a metal oxide obtained by the oxidization reaction of a metal becomes 20 nm or less, as a result.

At this time, as a method of oxidizing the metal film, oxidation in water vapor atmosphere, plasma oxidization, or the like in addition to the thermal processing can be exemplified. Through these methods, it is possible to accelerate the oxidization. In particular, the plasma oxidization has an advantage in that the plasma oxidization can be performed right before forming the interlayer insulation layer 160 by the plasma CVD method in a subsequent process, and no additional process is desired. In the plasma oxidation, for example, it is desirable to set a temperature of the transparent substrate 110 to be about 200° C. to 400° C., and to generate a plasma in oxygen or a gas atmosphere containing oxygen such as nitrous oxide to perform the processing. This is because it is possible to form the protective layer 150 having good barrier properties against the outside air as described above.

In order to realize sufficient protective layer function, it is desirable to form an insulation film with high barrier properties such as aluminum oxide as a protective layer subsequent to forming a metal film, so as to realize sufficient protective film function. For example, it is possible to form the protective layer 150 having sufficient protective layer function by continuously forming an aluminum oxide film having a film thickness of about 50 nm on the metal film.

Figure 7E:
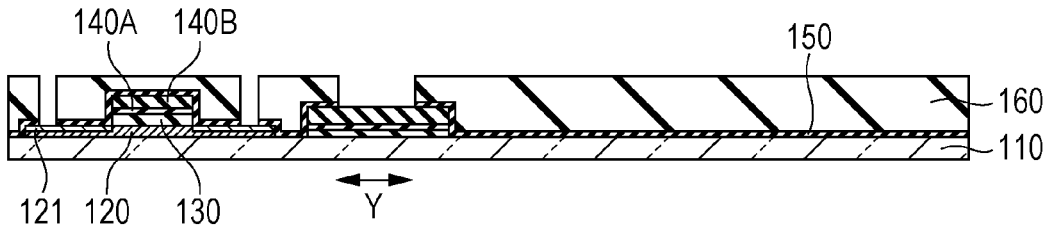

Next, the interlayer insulation layer 160 is formed of an organic film such as acrylic, polyimide, or siloxane in Process 5 of FIG. 7E. It is possible to easily form an insulation film with a thickness of about 2 um by applying the organic film. At the same time, it is possible to open the connection hole at a predetermined place using a process of light exposure and development. At this time, the interlayer insulation layer 160 may be formed to be a laminate structure which can be realized using a lamination film of the silicon oxide film and the organic layer.

Figure 7F:
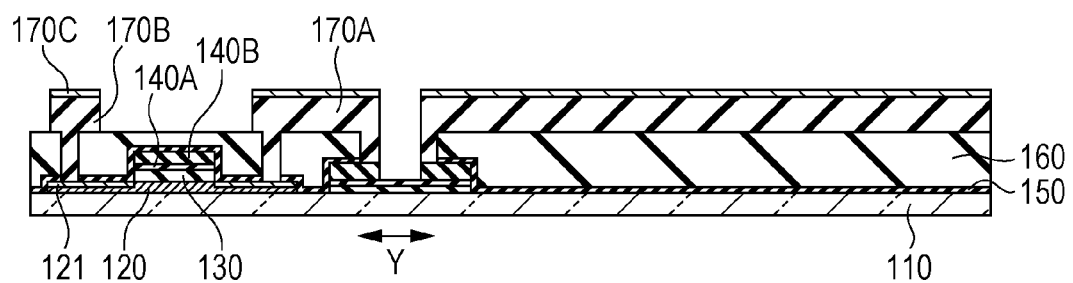

Next, in Process 6 of FIG. 7F, a lamination film of, for example, aluminum (Al) and molybdenum (Mo) are formed with a thickness of about 500 nm by the sputtering method on the interlayer insulation layer 160, and the source/drain electrode 170 (170A and 170B) is formed at a predetermined position by performing photolithography and etching. At this time, an electrode which is suitable to be used as an anode electrode is formed for an organic EL element such as aluminum which includes ITO or neodymium on an outermost surface of the source/drain electrode 170. Moreover, a layer of the second gate electrode 140B among the gate electrode layer exposed in the opening portion Y due to over-etching during a patterning of the source/drain electrode 170 is selectively etched. In addition, the source/drain electrode 170 is connected to the low resistance region 121 in the oxide semiconductor layer 120.

In this manner, after forming the thin film transistor 100 and the wirings 14A and 14B, the buried layer 180 having an opening on the conductive layer 170C is formed so as to cover the interlayer insulation layer 160 and the source/drain electrode 170. Then, the organic layer 13C is deposited by, for example, a vacuum deposition method. Subsequently, the cathode electrode 13B made from a material described above is formed by, for example, the sputtering method on the organic layer 13C. Then, the protective film 190 is deposited on the cathode electrode 13B by, for example, the CVD method, and then the sealing substrate (not shown) is bonded to the protective film 190 using the adhesive layer. Through the above processes, the display device 1 shown in FIG. 1 is completed.

Improvement of Dark Spot Defect

Then, a method for improving a dark spot defect (point defects such as a dark spot) in the display device 1 of the embodiment, that is, a method of recovering (fixing) a pixel which has a dark spot defect, will be described.

Figure 8:
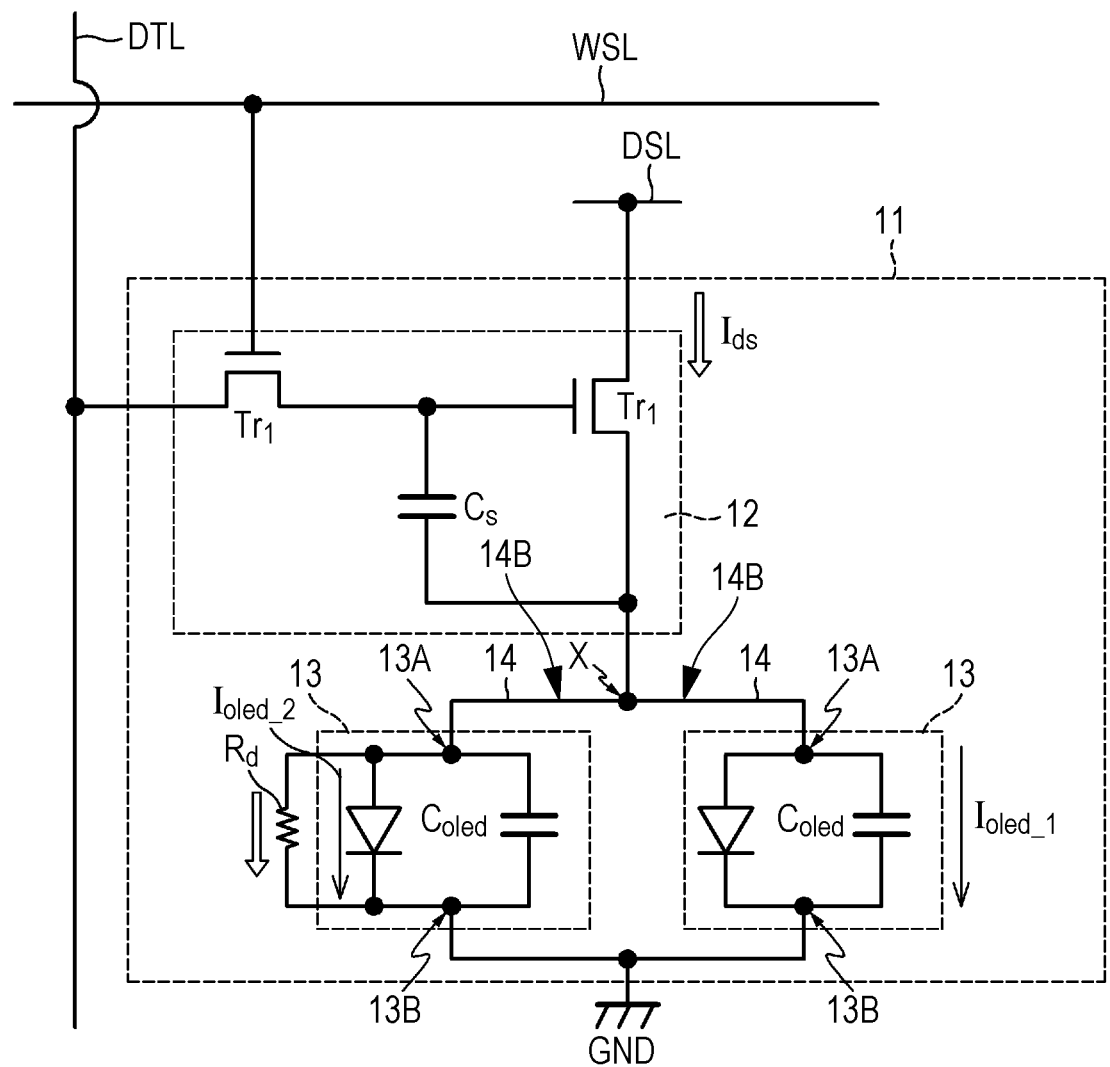
FIG. 8 is a circuit diagram which shows an example of a state in which a pixel has a dark spot defect.

FIG. 8 is a circuit diagram which shows an example of a state in which the pixel 11 has a dark spot defect. In FIG. 8, a low resistor $R_d$ corresponds to a foreign substance mixed in the process of forming the organic EL element 13. Due to the mixture of foreign substances, an inter-electrode short circuit is caused in one organic EL element 13 of the two organic EL elements 13 which are connected in parallel to each other. Therefore, a larger amount of current flows in the low resistance $R_d$ and the drive transistor $Tr_1$ than usual when there is no inter-electrode short circuit. Accordingly, only a very smaller amount of current than usual hardly flows in the two organic EL elements 13 when there is no inter-electrode short circuit. As a result, the two organic EL elements 13 do not emit light, and the pixel 11 has a dark spot defect.

Figure 9:
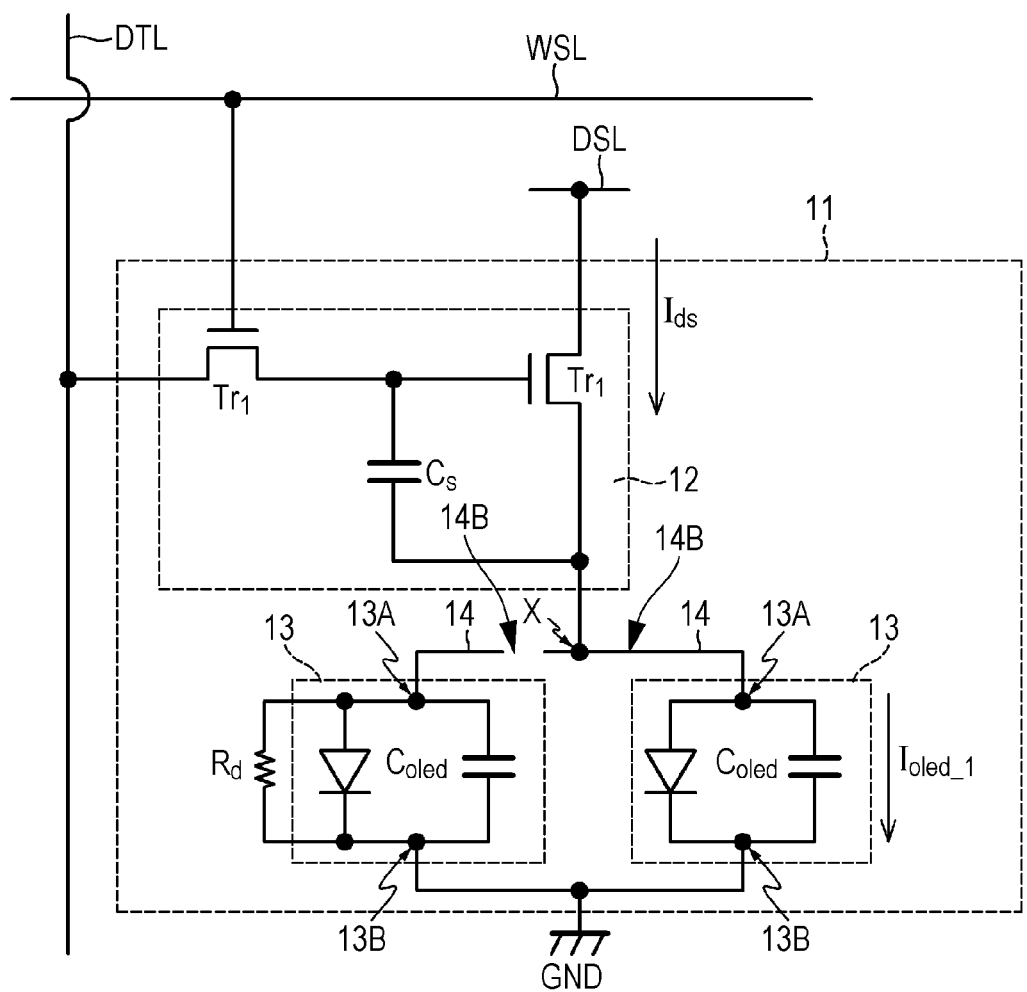
FIG. 9 is a circuit diagram which shows an example of a state in which a pixel of a dark spot defect in a display device of the embodiment is recovered.
Figure 10:
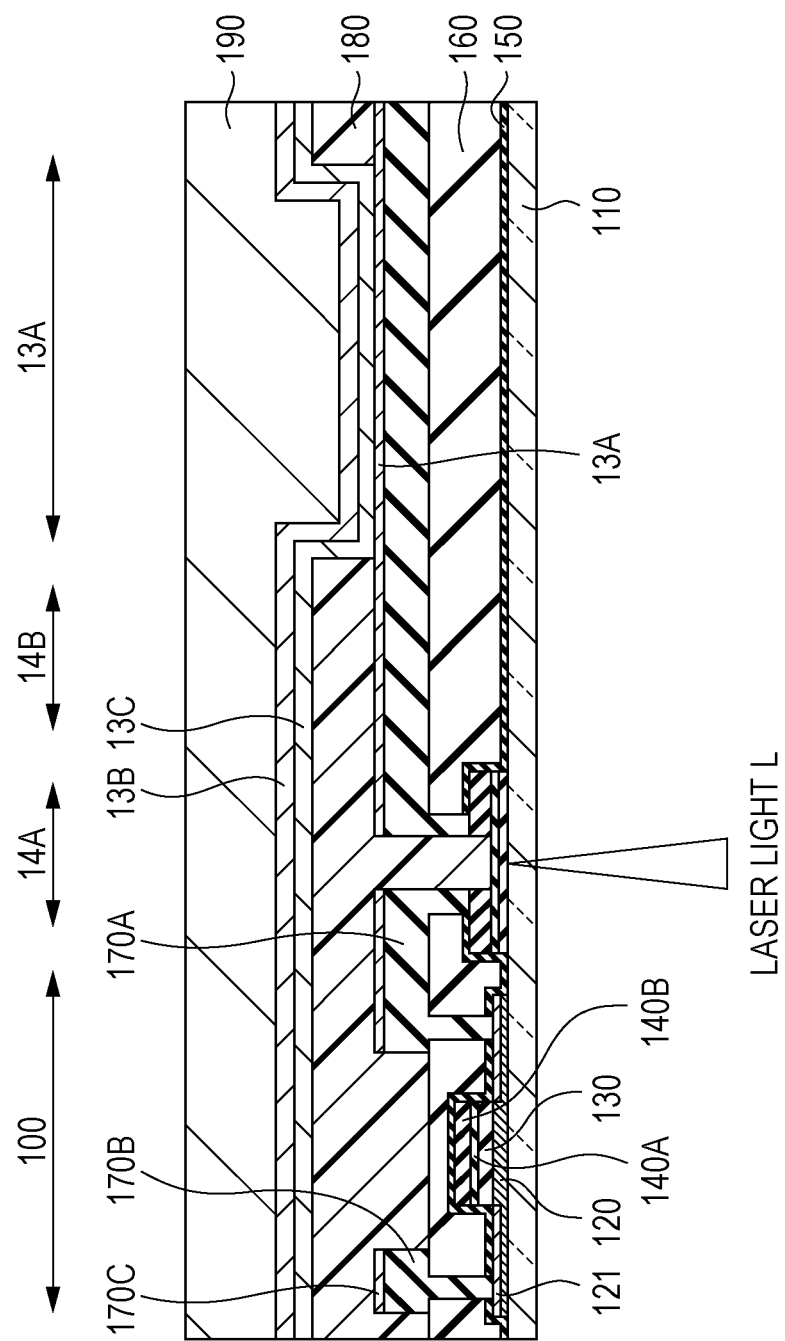
FIG. 10 is a cross-sectional view which shows an example of a state in which the pixel of a dark spot defect is recovered by emitting a laser light thereto.

In contrast, in the embodiment, for example, as shown in FIG. 9, a path of current flowing in the low resistance $R_d$ formed by the mixture of foreign substances is separated from a path of current flowing between a drain and a source of the drive transistor $Tr_1$. Specifically, as shown in FIG. 10, laser light L is emitted to a lower surface of the wiring 14B serially connected to the low resistance $R_d$. Due to the emission of laser light L, the first gate electrode 140A is removed. As a result, the wiring 14 is cut, and the path of current flowing in the low resistance Rd is separated from the path of current flowing between the drain and the source of the drive transistor $Tr_1$, such that the pixel 11 which has a dark spot defect is recovered.

Comparative Example

Figure 11:
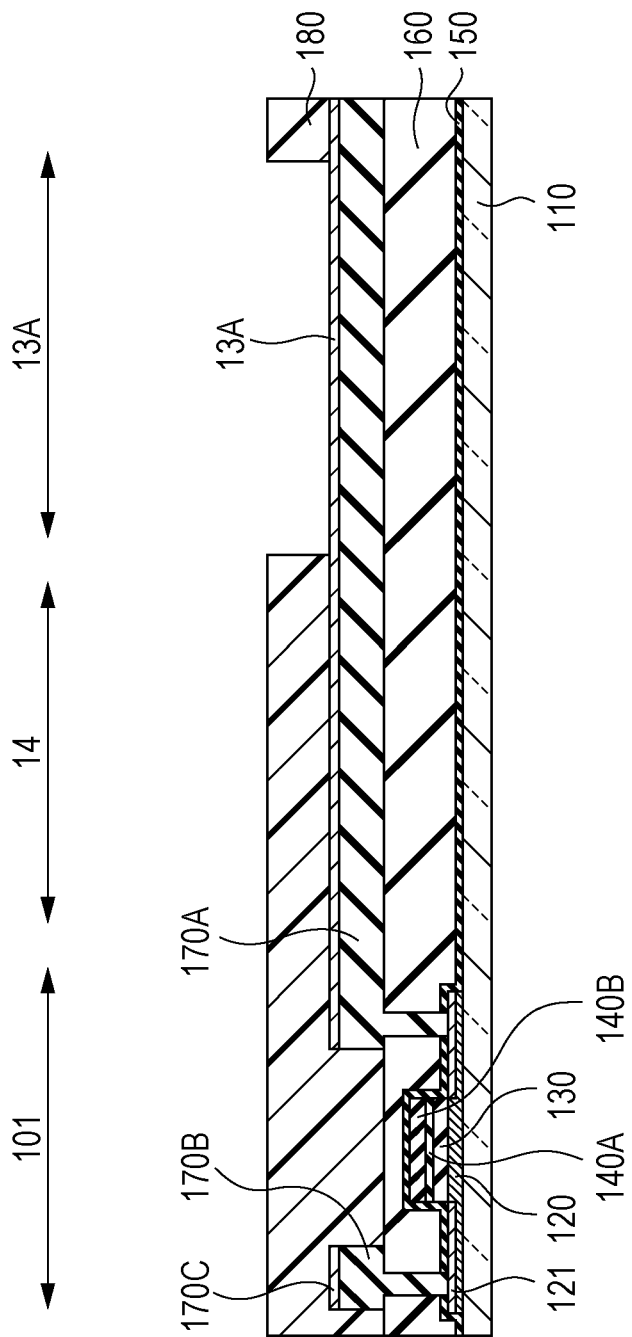
FIG. 11 is a cross-sectional view which shows a cross-sectional structure of a thin film transistor and the wiring configuring the coupling unit of the related art to which a technology of the disclosure is not applied.

A cross-sectional structure of the thin film transistor 101 and the wiring 14 of the related art to which a technology of the present disclosure is not applied is shown in FIG. 11. In a pixel structure made from the thin film transistor 101 and the wiring 14 of the related art, since a film thickness of the wiring 14 is thick, the wiring 14 is hardly cut by the emission of laser light L. This will be described more in detail as follows.

Here, as an example, in order to shorten the light exposure process, a case where a layer of the source/drain electrode 170 (170A and 170B) of the thin film transistor 100 configuring the pixel 11 and a layer of the anode electrode 13A which is a reflective electrode are commonized layers is considered. In this case, the wiring 14 is made to be up to several hundreds nm of thick or more to impart a low resistance to the wiring 14. Then, since a space in which a melted electrode material moves is hardly secured, and the film thickness of the wiring 14 is thick, it is difficult to cut the wiring 14 by the emission of laser light L after a completion of the display panel 10.

Modification Example

In the embodiment described above, when the pixel 11 has a plurality of organic EL elements 13 which are connected to each other in parallel, and one of the organic EL elements 13 has a defect due to a short-circuit between electrodes and the like caused by the mixture of foreign substances and the like, a case where the pixel 11 is recovered by cutting the wiring 14 corresponding to the organic EL element 13 is exemplified, but the embodiment is not limited thereto. Specifically, the technology of the present disclosure can be applied even to a display device of a configuration in which the pixel 11 has one of the organic EL elements 13. In this case, the pixel 11 which has a defect due to the inter-electrode short circuit is set to be an invalid pixel which does not contribute to display by cutting the wiring 14 (that is, the pixel becomes a dark spot).

Operation and Effect of the Embodiment

In the display device according to the embodiment described above, the source/drain electrodes 170 (170A and 170B) of the thin film transistor 100 and a layer of the anode electrode 13A which is a reflective electrode are commonized for the purpose of shortening a light exposure process. Since the number of manufacturing processes can be reduced through a reduction of the light exposure process, it is possible to reduce the cost of not only the display panel 10 but also the cost of the display device 1. Then, layers of the source/drain electrode 170 and the anode electrode 13A are commonized, and then a portion of the wiring 14 which configures the coupling unit connecting (electrically bond) the drive circuit 12 and the organic EL element 13 to each other becomes thinner. In other words, the wiring 14 configuring the coupling unit includes a metal layer which is thinner than the gate electrode 140 and the source/drain electrode 170 in the thin film transistor 101.

In this manner, the portion of the wiring 14 becomes thinner, and thereby, for example, even when any one of two organic EL elements 13 has a defect due to the inter-electrode short circuit and the like caused by the mixture of foreign substances and the like and the pixel 11 has a dark spot defect, it is possible to cut a thinned region of the wiring 14 with the emitted laser and the like. Accordingly, since the pixel 11 having a dark spot defect can be recovered, it is possible to improve a point defect such as a dark spot.

Moreover, since the wiring 14 which connects the drive circuit 12 and the organic EL element 13 to each other may be necessary to have a low resistance in a particularly large display panel, the wiring 14 is made to be thicker. Since the pixel 11 having a dark spot defect can be recovered by applying the technology of the present disclosure even to a large display panel in which the wiring 14 has to be thicker in this manner, it is possible to improve the point defect such as a dark spot. In other words, since it is possible to allow the wiring 14 to be thicker using the technology of the present disclosure applied particularly to a large display panel, and to achieve a low resistance of the wiring 14, image quality (display quality) can be improved.

Electronic Apparatus

The display device of the present disclosure described above can be applied to a display unit (display device) of an electronic apparatus in all fields in which an image signal input into an electronic apparatus or an image signal generated in the electronic apparatus is displayed as an image or a video. As an example, the display device can be used as a display unit of, for example, a television set, a digital camera, a laptop type personal computer, a portable terminal device such as a mobile phone, a video camera, and the like.

In this manner, it is possible to improve a display quality of various types of electronic apparatuses by using the display device of the disclosure as a display unit of the electronic apparatus in all fields. That is, as is apparent from the description of the embodiment described above, according to the display device of the disclosure, operations and effects of the followings can be obtained.

Since the number of manufacturing processes can be reduced, it is possible to reduce costs of the display device.

Since a pixel having a dark spot defect can be recovered, it is possible to improve a point defect such as a dark spot.

Since a low resistance of a coupling unit which connects a light-emitting element and a drive circuit thereof can be achieved, it is possible to improve an image quality. As a result, it is possible to reduce costs in the display device, and to increase the display quality and to obtain a good display image by using the display device of the disclosure as the display unit in various types of electronic apparatuses.

The display device of the disclosure includes a module-shaped display device with a sealed configuration. The display device is, as an example, a display module formed by attaching an opposing portion of a transparent glass or the like to the pixel array unit. In the display module, a circuit portion, a flexible printed circuit (FPC), and the like for inputting and outputting a signal and the like from the outside to a pixel array unit may be provided. In the following, a television set is exemplified as a specific example of the electronic apparatus using the display device of the disclosure. However, the specific example exemplified herein is merely one example, and is not limited thereto.

Specific Examples

Figure 12:
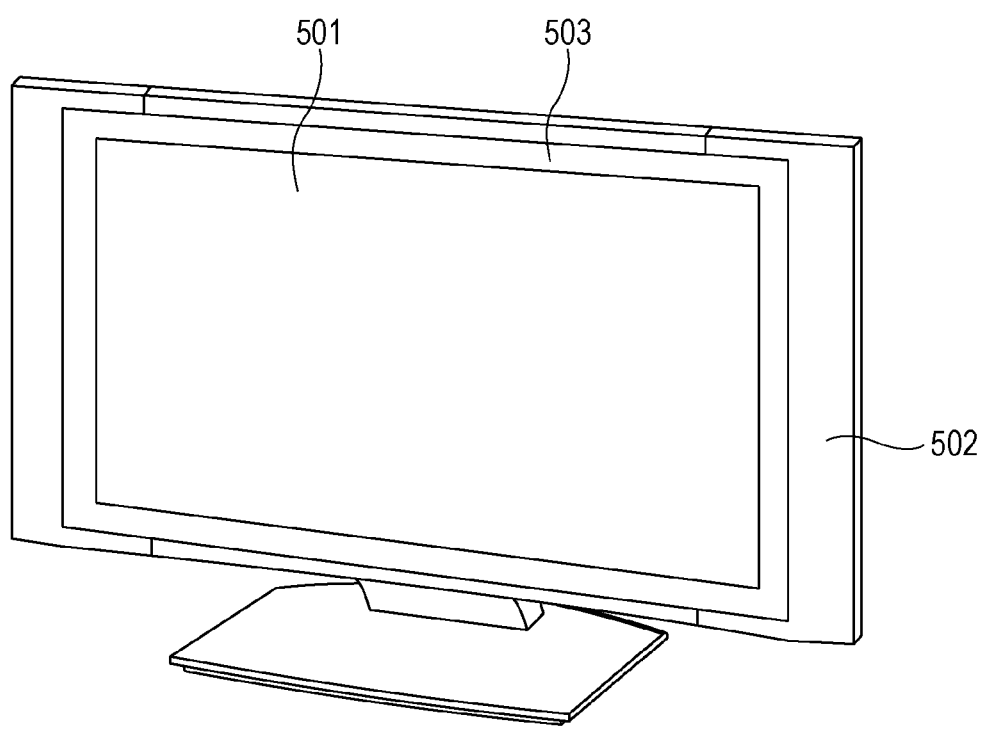
FIG. 12 is a perspective view which shows an appearance of a television set which is an example of an electronic apparatus of the disclosure.

FIG. 12 is a perspective view which shows the appearance of a television set which is an example of the electronic apparatus of the disclosure. The television set has an image display screen unit 101 which is configured from a front panel 102, a filter glass 103, or the like. In the television set, it is possible to use the display device of the disclosure as the image display screen unit 101. That is, the television set according to the present example is produced by using the display device of the disclosure as the image display screen unit 101.

The present disclosure can adopt the following configurations.

[1]

A display device includes a plurality of pixels, in which a pixel includes a light-emitting element, a drive circuit which has a thin film transistor driving the light-emitting element, and a coupling unit which connects the light-emitting element and the drive circuit to each other, the light-emitting element has a configuration in which an organic layer including a light-emitting layer is interposed between a transparent electrode and a reflective electrode, the thin film transistor has a configuration that includes a semiconductor layer, an insulation layer, a first electrode layer, and a second electrode layer, and the coupling unit includes a metal layer which is thinner than the first electrode and the second electrode of the thin film transistor, the metal layer being disposed in a portion of the coupling unit.

[2]

The display device described in [1], in which the first electrode layer of the thin film transistor is a gate electrode layer.

[3]

The display device described in [1] or [2], in which the first electrode layer of the thin film transistor has a lamination structure.

[4]

The display device described in any one of [1] to [3], in which the first electrode layer and the second electrode layer of the thin film transistor include the same metal, respectively.

[5]

The display device described in [4], in which the first electrode layer is configured to have titanium and aluminum, or a lamination film containing a layer of an aluminum alloy, and the second electrode layer is configured to have an aluminum alloy or a lamination film containing the aluminum alloy.

[6]

The display device described in any one of [1] to [5], in which the pixel includes a plurality of light-emitting elements, and the coupling unit connects each of the plurality of light-emitting elements and the drive circuit to each other.

[7]

The display device described in any one of [1] to [6], in which a reflective electrode layer of the light-emitting element and a second electrode layer of the thin film transistor are commonized.

[8]

The display device described in any one of [1] to [7] further includes a light-shielding layer which prevents at least one portion of a silhouette of the coupling unit from being visually confirmed from the outside.

[9]

A method of manufacturing the display device for performing each process includes forming a coupling unit which includes a first electrode layer on a transparent substrate, forming an interlayer insulation layer on the coupling unit, and patterning a second electrode at a predetermined position of the interlayer insulation layer after forming an opening portion at a predetermined place on the interlayer insulation layer, and removing a portion of the coupling unit through the opening portion by performing over-etching during the patterning of the second electrode layer, in which the display device includes a plurality of pixels, a pixel includes a light-emitting element, a drive circuit which has a thin film transistor driving the light-emitting element, and a coupling unit which connects the light-emitting element and the drive circuit to each other, the light-emitting element has a configuration in which an organic layer including a light-emitting layer is interposed between a transparent electrode and a reflective electrode, the thin film transistor has a configuration which includes a semiconductor layer, an insulation layer, a first electrode layer, and a second electrode layer, and the coupling unit includes a metal film which is thinner than the first electrode layer and the second electrode layer of the thin film transistor, the metal layer being disposed in one portion of the coupling unit.

[10]

An electronic apparatus includes a display device which includes a plurality of pixels, in which a pixel includes a light-emitting element, a drive circuit which has a thin film transistor driving the light-emitting element, and a coupling unit which connects the light-emitting element and the drive circuit to each other, the light-emitting element has a configuration in which an organic layer including a light-emitting layer is interposed between a transparent electrode and a reflective electrode, the thin film transistor includes a semiconductor layer, an insulation layer, a first electrode layer, and a second electrode layer, and the coupling unit includes a metal layer which is thinner than the first electrode layer and the second electrode layer of the thin film transistor, the metal layer being disposed in one portion of the coupling unit.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   a plurality of pixels,
   wherein a pixel includes a light-emitting element, a drive circuit which has a thin film transistor driving the light-emitting element, and a coupling unit which connects the light-emitting element and the drive circuit to each other,
   the light-emitting element has a configuration in which an organic layer including a light-emitting layer is interposed between a transparent electrode and a reflective electrode,
   the thin film transistor has a configuration which includes a semiconductor layer, an insulation layer, a first electrode layer, and a second electrode layer, and
   the coupling unit includes a metal layer which is thinner than the first electrode and the second electrode of the thin film transistor, the metal layer being disposed in one portion of the coupling unit,
   wherein the first electrode layer of the thin film transistor is a gate electrode layer.

2. The display device according to claim 1,
   wherein the first electrode layer of the thin film transistor has a lamination structure.

3. The display device according to claim 1,
   wherein the first electrode layer and the second electrode layer of the thin film transistor include the same metal, respectively.

4. The display device according to claim 3,
   wherein the first electrode layer is configured to have titanium and aluminum, or a lamination film containing a layer of an aluminum alloy, and
   the second electrode layer is configured to have an aluminum alloy or a lamination film containing the aluminum alloy.

5. The display device according to claim 1,
   wherein the pixel includes a plurality of light-emitting elements, and
   the coupling unit connects each of the plurality of light-emitting elements and the drive circuit to each other.

6. The display device according to claim 1, further comprising a light-shielding layer which prevents at least one portion of a silhouette of the coupling unit from being visually confirmed from the outside.

7. The display device according to claim 1, wherein a layer of the reflective electrode of the light-emitting element and the second electrode layer of the thin film transistor are commonized.

8. A display device comprising:
   a plurality of pixels,
   wherein a pixel includes a light-emitting element, a drive circuit which has a thin film transistor driving the light-emitting element, and a coupling unit which connects the light-emitting element and the drive circuit to each other,
   the light-emitting element has a configuration in which an organic layer including a light-emitting layer is interposed between a transparent electrode and a reflective electrode,
   the thin film transistor has a configuration which includes a semiconductor layer, an insulation layer, a first electrode layer, and a second electrode layer, and
   the coupling unit includes a metal layer which is thinner than the first electrode and the second electrode of the thin film transistor, the metal layer being disposed in one portion of the coupling unit,
   wherein a layer of the reflective electrode of the light-emitting element and the second electrode layer of the thin film transistor are commonized.

9. An electronic apparatus comprising the display device according to claim 8.

10. An electronic apparatus comprising:
    a display device which includes
    a plurality of pixels,
    wherein a pixel includes a light-emitting element, a drive circuit which has a thin film transistor driving the light-emitting element, and a coupling unit which connects the light-emitting element and the drive circuit to each other,
    the light-emitting element has a configuration in which an organic layer including a light-emitting layer is interposed between a transparent electrode and a reflective electrode,
    the thin film transistor includes a semiconductor layer, an insulation layer, a first electrode layer, and a second electrode layer, and
    the coupling unit includes a metal layer which is thinner than the first electrode layer and the second electrode layer of the thin film transistor, the metal layer being disposed in one portion of the coupling unit,
    wherein the first electrode layer of the thin film transistor is a gate electrode layer.

* * * * *